United States Patent
Burns et al.

(10) Patent No.: US 10,613,146 B2
(45) Date of Patent: Apr. 7, 2020

(54) TEST APPARATUS AND METHODS FOR ARC MITIGATION DEVICE

(71) Applicant: Eaton Intelligent Power Limited, Dublin (IE)

(72) Inventors: Robert J. Burns, Hendersonville, NC (US); Dan E. Hrncir, Arden, NC (US); David A. Metcalf, Black Mountain, NC (US)

(73) Assignee: Eaton Intelligent Power Limited (IE)

( * ) Notice: Subject to any disclaimer, the term of this patent is extended or adjusted under 35 U.S.C. 154(b) by 140 days.

(21) Appl. No.: 15/855,154

(22) Filed: Dec. 27, 2017

(65) Prior Publication Data

US 2019/0195949 A1    Jun. 27, 2019

(51) Int. Cl.
*G01R 31/00* (2006.01)
*G01R 31/327* (2006.01)
(Continued)

(52) U.S. Cl.
CPC ......... *G01R 31/3275* (2013.01); *G01R 31/14* (2013.01); *G01R 31/307* (2013.01);
(Continued)

(58) Field of Classification Search
CPC .......... H02S 50/10; H02S 40/34; H02S 50/00; H02S 99/00; G01R 31/311; G01R 31/307; G01R 31/308; G01R 31/309
(Continued)

(56) References Cited

U.S. PATENT DOCUMENTS

2007/0208520 A1* 9/2007 Zhang ................. H02H 1/0015
702/58
2010/0073013 A1    3/2010 Zeller et al.
(Continued)

FOREIGN PATENT DOCUMENTS

GB    2 225 185 A    5/1990

OTHER PUBLICATIONS

Notification of Transmittal of the International Search Report and the Written Opinion of the International Searching Authority, or the Declaration, PCT/EP2018/025330, dated Mar. 15, 2019, 14 pages.
(Continued)

*Primary Examiner* — Raul J Rios Russo
(74) *Attorney, Agent, or Firm* — Stanek Lemon Crouse & Meeks, P.A.

(57) ABSTRACT

A test apparatus includes an output configured to be coupled to a sense input of an arc quenching device control circuit of an arc quenching system, a user interface, and a control circuit configured to generate a simulated sense signal at the output in response to an input at the user interface, the simulated sense signal representing a physical state associated with a fault condition of a bus coupled to the arc quenching system. The simulated sense signal may be configured to cause the arc quenching device control circuit to trigger an arc quenching device of the arc quenching system. The physical state may include, for example, a voltage condition, a current condition, a temperature, a pressure or a light intensity. In some embodiments, the simulated sense signal may include a current indicative of a current passing through a bus to which the arc quenching system is connected.

17 Claims, 6 Drawing Sheets

(51) Int. Cl.
*H01H 33/59* (2006.01)
*H02H 3/04* (2006.01)
*G01R 31/14* (2006.01)
*H02S 50/10* (2014.01)
*H02S 40/34* (2014.01)
*H02S 50/00* (2014.01)
*H02S 99/00* (2014.01)
*G01R 31/311* (2006.01)
*G01R 31/307* (2006.01)
*G01R 31/308* (2006.01)
*G01R 31/309* (2006.01)

(52) U.S. Cl.
CPC .......... *G01R 31/311* (2013.01); *G01R 31/327* (2013.01); *H01H 33/59* (2013.01); *H02H 3/044* (2013.01); *H02S 40/34* (2014.12); *H02S 50/00* (2013.01); *H02S 50/10* (2014.12); *H02S 99/00* (2013.01); *G01R 31/308* (2013.01); *G01R 31/309* (2013.01)

(58) Field of Classification Search
USPC ................................. 324/71.3, 133, 500, 501
See application file for complete search history.

(56) References Cited

U.S. PATENT DOCUMENTS

| | | | |
|---|---|---|---|
| 2011/0115511 A1* | 5/2011 | Finlay, Sr. | H01H 83/04 324/750.3 |
| 2011/0148423 A1* | 6/2011 | Richards | G01R 31/14 324/424 |
| 2013/0194702 A1 | 8/2013 | Asokan et al. | |
| 2015/0077884 A1* | 3/2015 | Behrends | H02H 1/0015 361/5 |
| 2016/0055999 A1* | 2/2016 | Nanrudaiyan | H01H 33/08 361/102 |
| 2016/0285259 A1 | 9/2016 | Shea et al. | |
| 2019/0287742 A1* | 9/2019 | Omori | H01H 9/542 |

OTHER PUBLICATIONS

*Arc Vault Protection System*; www.geindustrial.com/products/switchgear/arc-vault-protection-system; General Electric Industrial Solutions; 3 pages.

* cited by examiner

TEST APPARATUS AND METHODS FOR ARC MITIGATION DEVICE

BACKGROUND

The inventive subject matter relates to electrical equipment and, more particularly, to arc mitigation in electrical equipment.

Low and medium voltage equipment, such as motor drives, switchgear and the like, present an electrical safety hazard due to the presence of relatively high voltages. Such equipment may present, for example, arc flash hazards arising from equipment degradation, contamination, and accidents, such as accidents occurring during maintenance operations. Arc flashes may be extremely hazardous to personnel and may cause damage that is difficult and expensive to repair and may lead to significant downtime losses.

Accordingly, several approaches have been developed to contain and minimize damage from arc flashes. For example, equipment may be constructed with structural features that shield sensitive components from the worst effects of arc flashes. Such features may include placing components that are prone to arc flashes in special compartments or other structures, and using ducts and plenums to direct arc flash heat and gases away from personnel and sensitive components.

Active arc quenching systems have also been developed. These systems may extinguish arcs by detecting an arc and creating another arc within a sealed compartment, chamber or other containment system that channels energy away from the original arc. Examples of such arc quenching systems are described in U.S. Patent Application Publication No. 2016/0285259 to Shea et al. and U.S. Patent Application Publication No. 2013/0194702 to Asokan et al. A commercially available arc mitigation system is the Arc Vault™ system developed by General Electric Co, described at http://www.geindustrial.com/products/switchgear/arc-vault-protection-system.

SUMMARY

Some embodiments of the inventive subject matter provide a test apparatus including an output configured to be coupled to a sense input of an arc quenching device control circuit of an arc quenching system, a user interface, and a control circuit configured to generate a simulated sense signal at the output in response to an input at the user interface, the simulated sense signal representing a physical state associated with a fault condition of a bus coupled to the arc quenching system. The simulated sense signal may be configured to cause the arc quenching device control circuit to trigger an arc quenching device of the arc quenching system. The physical state may include, for example, a voltage condition, a current condition, a temperature, a pressure or a light intensity.

In some embodiments, the simulated sense signal may include a current indicative of a current passing through a bus to which the arc quenching system is connected. For example, the simulated sense signal may include an AC current simulating a current produced by a current transformer. The current produced by the control circuit may be adjustable responsive to the user interface.

According to further embodiments, the control circuit may be configured to cause a light source to emit light concurrent with assertion of the simulated sense signal. The control circuit may further include a light source control output configured to be coupled to the light source and the control circuit may be configured to assert a light source control signal at the light source control output to cause the light source to emit light concurrent with assertion of the current sense signal.

The test apparatus may further include an enable/disable signal output configured to be coupled to an enable/disable signal input of the arc quenching device control circuit. The control circuit may be configured to assert an enable/disable signal at the enable/disable signal output.

In further embodiments, the test apparatus may further include a housing that houses the control circuit and provides external access to the signal output. The housing may be portable.

Further embodiments provide a test apparatus including an output configured to be coupled to a current transformer input of arc quenching device control circuit of an arc quenching system, a user interface, and a control circuit configured to generate a current at the output concurrent with emission from a light source responsive to the user interface. The current may be sufficient to cause the arc quenching device control circuit to trigger an arc quenching device. The current may be an AC current, and may be adjustable responsive to the user interface. The control circuit may further include an enable/disable signal output configured to be coupled to an enable/disable signal input of the arc quenching device control circuit and the control circuit may be configured to assert an enable/disable signal at the enable/disable signal output. The control circuit may be configured to control emission of light by the light source.

DETAILED DESCRIPTION

Figure 1:
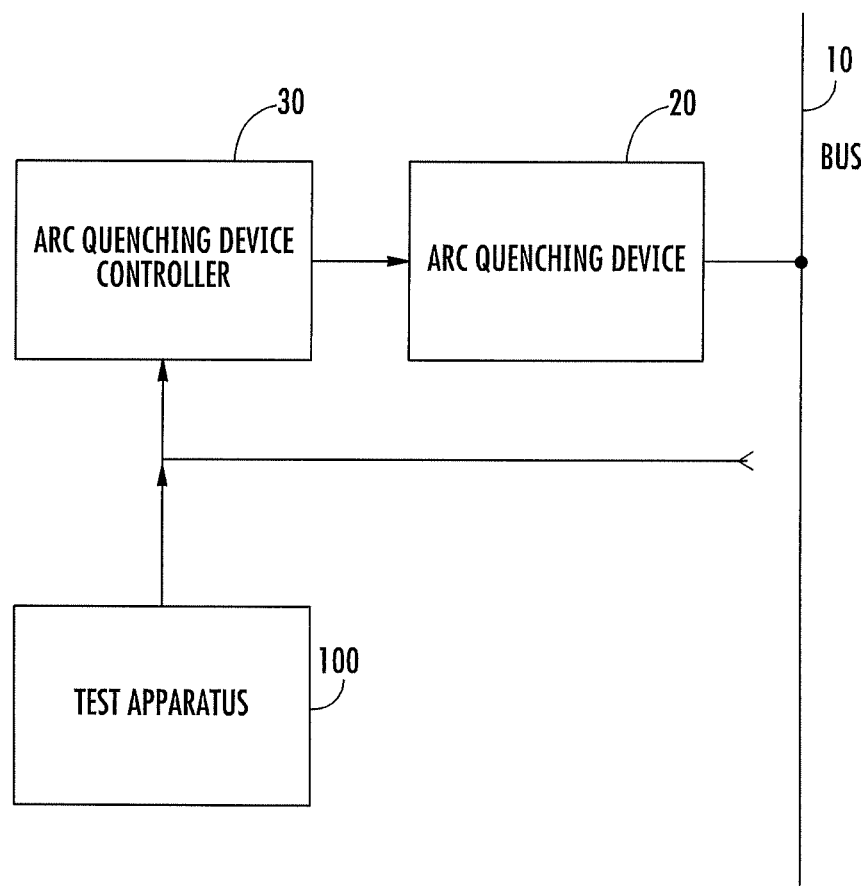
FIG. 1 is a schematic diagram illustrating a test system according to some embodiments.

Specific exemplary embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like items. It will be understood that when an item is referred to as being "connected" or "coupled" to another item, it can be directly connected or coupled to the other item or intervening items may be present. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, items, and/or components, but do not preclude the presence or addition of one or more other features, integers, steps, operations, items, components, and/ or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

FIG. 1 illustrates an arrangement for testing an arc quenching system according to some embodiments of the inventive subject matter. The arc quenching system includes an arc quenching device 20 which is coupled to a bus 10. The arc quenching device 20 may, for example, be a device that generates a controlled (e.g., contained) arc to extinguish an arc associated with the bus 10, in a manner along the lines described in the aforementioned U.S. Patent Application Publication No. 2016/0285259 to Shea et al. The arc quenching device 20 is controlled by an arc quenching device controller 30, which may detect one or more physical states associated with the bus 10, such as a voltage on the bus 10, a current passing through the bus 10, an ambient temperature in the vicinity of the bus or an device coupled thereto, an ambient pressure in the vicinity of the bus 10 or a device coupled thereto, and/or a light intensity in the vicinity of the bus or a device coupled thereto. As will be appreciated, these parameters may be indicative of the presence of an arc associated with the bus 10 or a device coupled thereto, e.g., distortion of the voltage waveform on the bus 10, elevation of current passing through the bus 10, increased temperature or pressure and/or illumination may be indicative of a fault and associated arc flash. Responsive to detecting a state of the sensed parameter(s) that likely corresponds to the presence of an arc, the arc quenching device controller 30 triggers the arc quenching device 20, which may responsively generate a controlled arc that extinguishes the arc.

As further shown, a test apparatus 100 may be configured to apply a simulated sense signal to the arc quenching device controller 30, which may mimic parameter conditions for physical states associated with an arc. In some embodiments described below, the test apparatus 100 may be configured, for example, to generate a current that mimics the output of a current transformer that senses current on the bus 10. Application of the current may cause the arc quenching device controller 30 to react as if an actual arc is present and attempt to activate the arc quenching device 20. In some embodiments, the arc quenching device controller 30 may also be sensitive to light, and application of the simulated current by the test apparatus may occur concurrent with the generation of light that mimics the light associated with an arc flash. In some embodiments, the test apparatus 100 may be configured to generate the light. It will be appreciated, however, that, in some embodiments, the test apparatus may be configured to generate other simulated sense signals that may be applied to the arc quenching device controller 30, such as voltage signals, pressure signals and/or temperature signals.

Figure 2:
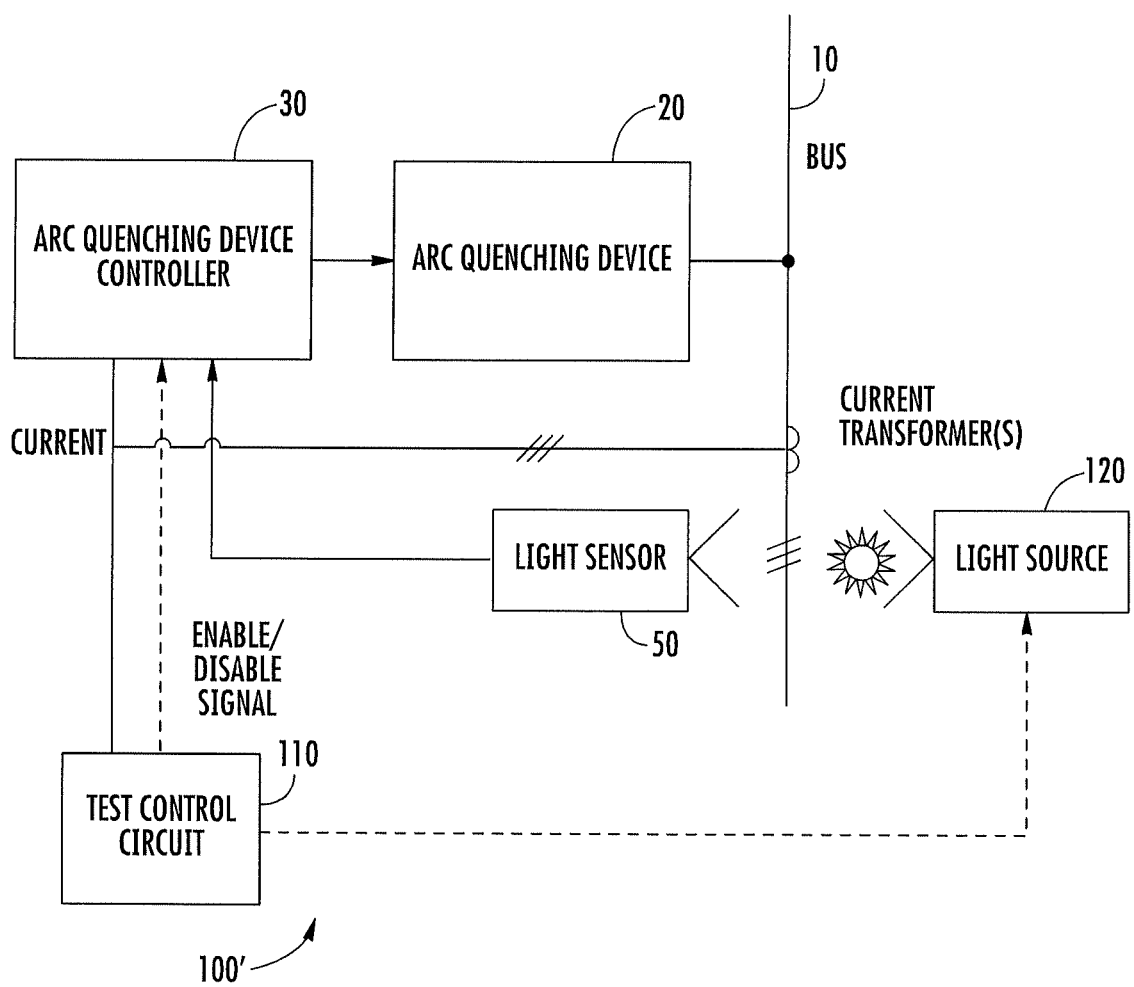
FIG. 2 is a schematic diagram illustrating a test system according to further embodiments.

FIG. 2 illustrates a test apparatus 100' for an arc quenching system according to further embodiments of the inventive subject matter. The arc quenching system includes an arc quenching device 20 which is coupled to a bus 10. The arc quenching device 20 is controlled by an arc quenching device controller 30, which is coupled to a current sensor, such as one or more current transformers (CTs) 40 that detect a current on the bus 10. The arc quenching device controller 30 is also coupled to a light sensor 50 that detects arc flashes associated with arcs. Responsive to detecting a bus current and light indicative of the presence of an arc, the arc quenching device controller 30 triggers the arc quenching device 20, which may responsively generate a controlled arc that extinguishes the arc on the bus 10.

The test apparatus 100' includes a test control circuit 110 and a light source 120. The test control circuit 110 applies a current signal to the arc quenching device controller 30 that simulates a current signal provided by the one or more CTs 40 in response to an actual arc, i.e., the simulated current signal has characteristics sufficient to trigger a properly operational arc quenching system. For example, the one or more CTs 40 may generate AC currents responsive to AC currents in the bus 10, and the arc quenching device controller 30 may be configured to activate the arc quenching device 20 when one or more currents produced by the one or more CTs 40 exceed a certain level. Accordingly, the current signal produced by the test control circuit 110 may be, for example, an AC current signal that mimics a CT output or a current signal with a different waveform (e.g., a pulse train) that provides sufficient energy or other characteristics to trigger operation of the arc quenching device controller 30. It will be appreciated that the nature of the current signal produced by the test control circuit 110 may generally depend on the characteristics of the control circuitry of the arc quenching system under test. For example, if the arc quenching system uses current sensors other than CTs that produce other types of current signals (e.g., voltages representative of currents), the test control circuit 110 may produce simulated current signals in that form.

The light source 120 may be, for example, one or more portable light sources that may be placed near certain bus locations in a unit under test and/or one or more light sources that are incorporated in a unit under test near such locations. The test control circuit 110 may be configured to assert the current signal concurrent with emission of light for the light source 120, which may simulate light produced by an actual arc flash. Responsive to detection of concurrent assertion of the current sense signal and the light flash, a properly operating arc quenching device controller 30 should attempt to activate the arc quenching device 20. It will be appreciated that the light source 120 may, for example, be turned on before assertion of the current signal by the test control circuit 110 to trigger operation of the arc quenching device controller 30. In some embodiments, however, the current signal may be established by the test control circuit 110 before emission of light from the light source 120, such that the arc quenching device controller 30 may be triggered by light emission from the light source 120. In still further embodiments, the light source 120 may be flashed substantially at the same time as assertion of the current signal. As shown, the test control circuit 110 may be configured to control the light source 120 to provide such coordinated operations.

In some embodiments, the results of a test conducted by the test apparatus 100 may be indicated to a user. For example, in some embodiments the arc quenching device controller 20 may generate a status signal that indicates a status of the arc quenching device 20, e.g., a signal that indicates whether or not the arc quenching device 20 has operated and/or a signal indicating that the arc quenching device controller 30 has detected an arc condition that would cause it to trigger the arc quenching device 20. In some embodiments, the test control circuit 110 may receive a status signal from the arc quenching device 20 and/or the arc quenching device controller 30 in response to assertion of the current sense signal and light flash, such as a signal indicating that the arc quenching device controller 30 has detected an arc and appropriately operated (or attempted to operate) the arc quenching device 20. Such a status signal may be used to generate an indication to a user of the test apparatus 100', such as a display that indicates whether a test has succeeded. The test control circuit 110 may be further configured, for example, to determine a delay between the time the test control circuit 110 asserts signals to trigger activation of the arc quenching device controller 30, and the time an indication of the of the response of the arc quenching device controller 30 is provided to the test control circuit 110. Such timing information may be used, for example, to assess the response time of the arc quenching system, which may be required to verify that the arc quenching system will operate sufficiently quickly to prevent significant damage to equipment or injury to personnel.

In some embodiments, a test may result in an actual activation of the arc quenching device 20. In some embodiments, however, it may not be desirable to actually operate the arc quenching device 20. For example, the arc quenching device 20 may include single-use components that might be consumed by the test, and it may not be desirable to exhaust such components in a test. In some embodiments, the test control circuit 110 may assert an enable/disable signal that can prevent actual firing of the arc quenching device 20 during the test, thus preventing generation of an actual arc in response to the command signal. This can protect test personnel and prevent certain operations of the arc quenching device 20 that consume single-use components.

Figure 3:
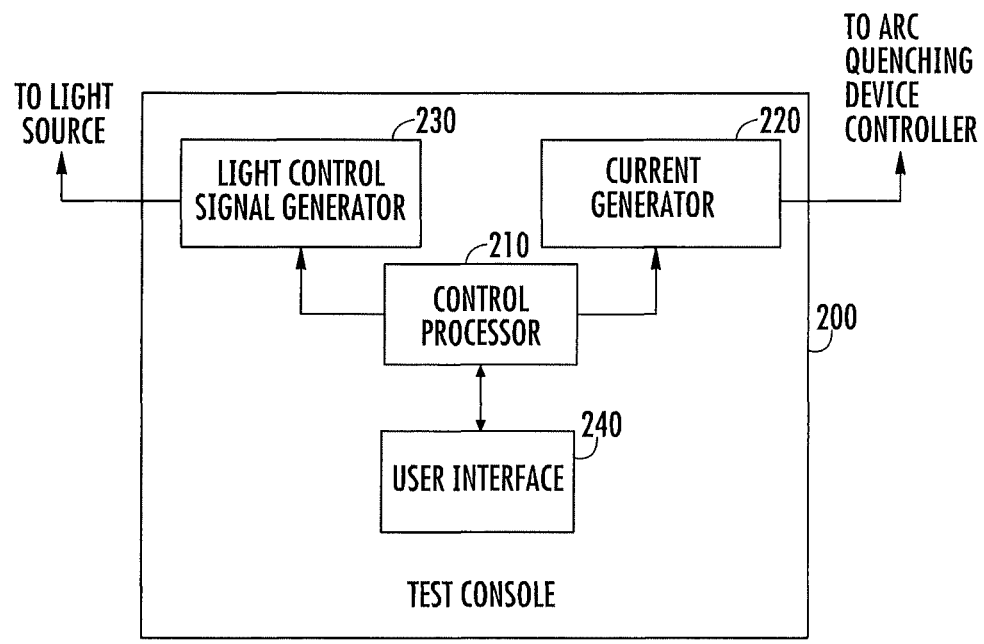
FIG. 3 is a schematic diagram illustrating a test console according to some embodiments.

According to some embodiments illustrated in FIG. 3, a test system along the lines illustrated in FIG. 2 may include a test console 200 that is configured to be connected to an arc quenching system and an external light source. The test console 200 may be, for example, a portable device that is designed to test arc quenching systems that are installed in switchgear or other electrical apparatus. As illustrated, the test console 200 may include a processor 210, such as a microcontroller and associated peripheral circuitry (e.g., memory and I/O circuitry), which is configured to receive inputs from and provide outputs to a user via a user interface 240, such as a keyboard, keypad or touchscreen. User inputs may include, for example, trigger commands to initiate a test and/or calibration inputs, such as current signal levels or other parameters for a test. The processor 210 is also coupled to a current generator circuit 220, which may be configured to generate a current that simulates a current sense signal produced by CTs or other current sensing devices in the unit under test. For example, the current generator circuit 220 may include an inverter or other power electronics circuit that is designed to generate an AC current that mimics the output of CTs in the unit under test. The processor 210 is also coupled to a light control signal generator circuit 230, which is configured to generate a control single for one or more external light sources, which may be also be portable and/or may be permanently installed in the unit under test.

Figure 4:
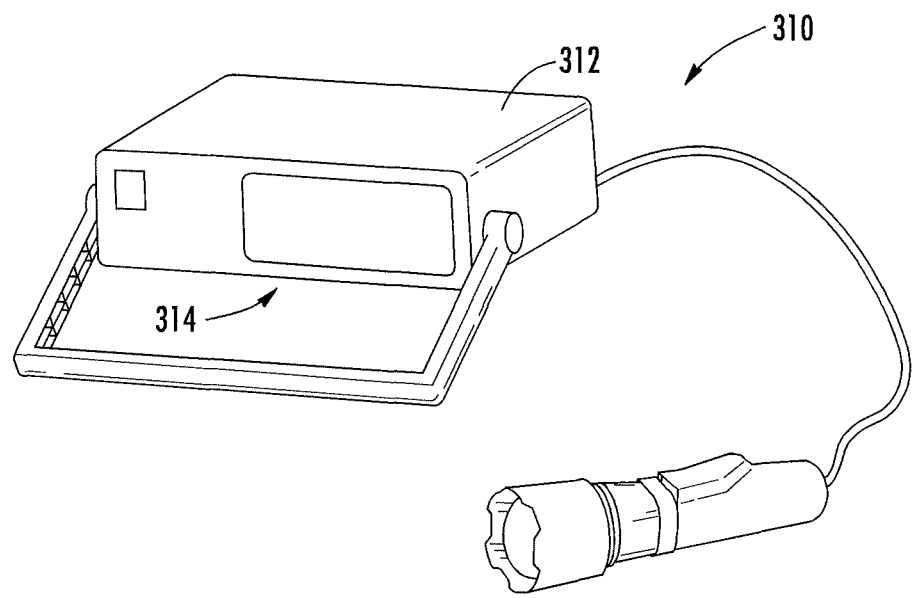
FIGS. 4-6 are views of a test console according to further embodiments.
Figure 5:
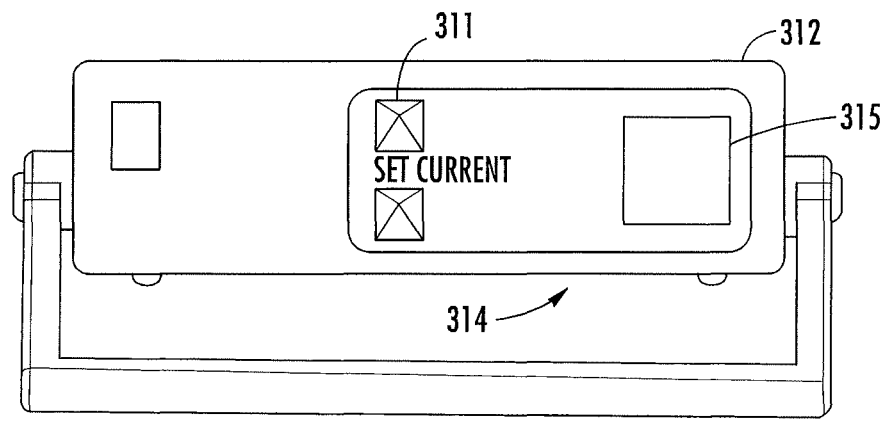
Figure 6:
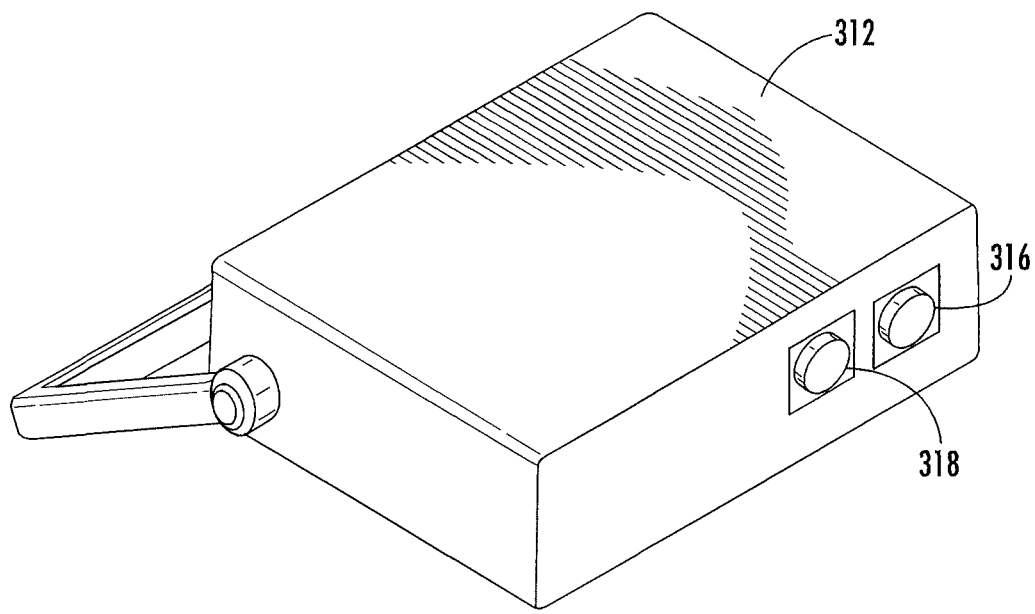

FIGS. 4-6 illustrate an example of a form factor for such a test console. A test console 310 may include a housing 312 that is configured to house electronic components, such as the test console components described above with reference to FIG. 3. A user interface 314 is provided at a face of the housing 312, and is configured to accept inputs from and provide information to a user of the test console 310. For example, as shown in FIG. 5, the user interface 314 may include switches 311 and a display 315 that enable a user to set a current level produced by the current generator circuit of the test console 310, and a switch 313 configured to accept a triggering command for the test console 310. The display 315 may also provide test status information to a user, such as information as to the result of a given test operation. As shown in FIG. 5, the test console 310 may further include connectors 316, 318 for connecting the test console 310 to an arc quenching system and a light source, respectively.

Figure 7:
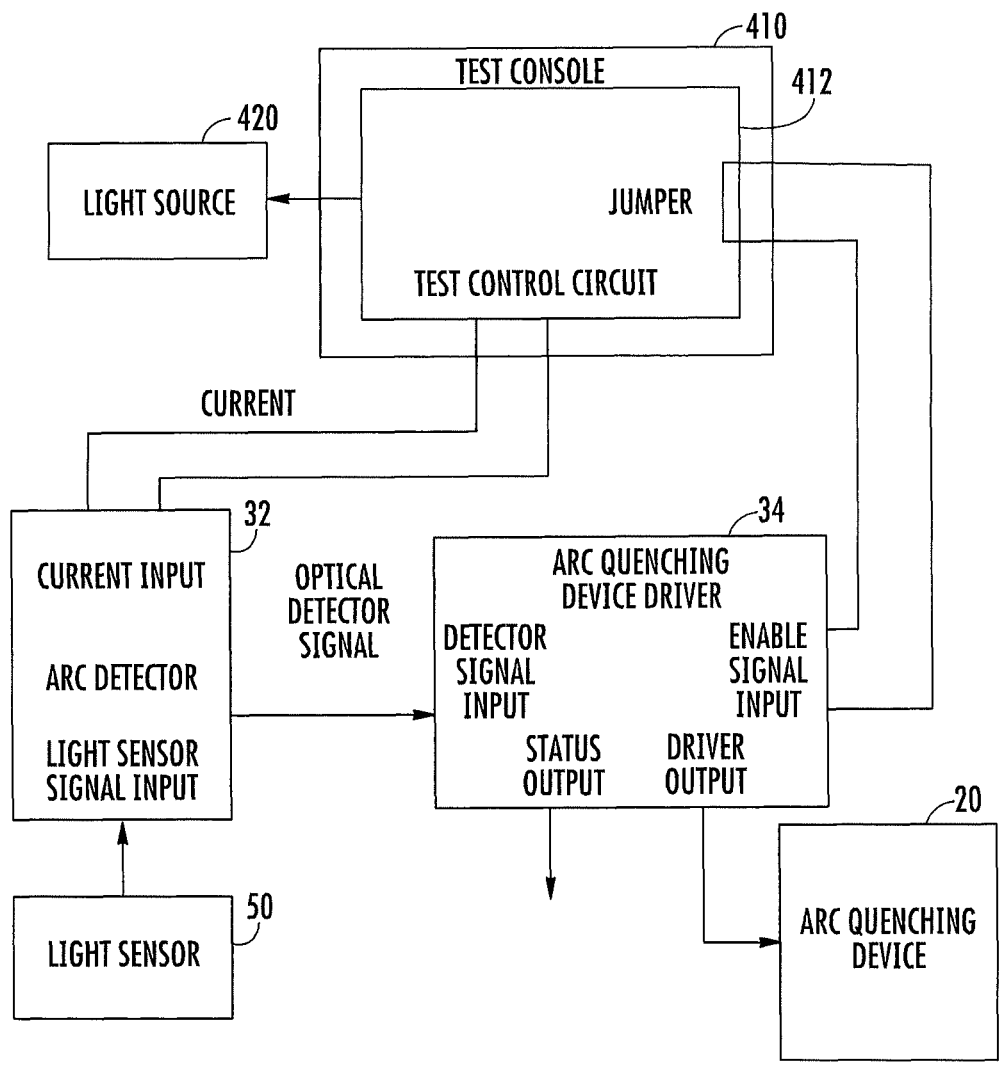
FIG. 7 is a schematic diagram illustrating an arc quenching system and test apparatus according to some embodiments.

FIG. 7 illustrates a test setup according to further embodiments. An arc quenching system includes an arc detector circuit 32 and an arc quenching device driver circuit 34. The arc detector circuit 32 has current sense input configured to receive a current input from a current sensor, such as one or more CTs (not shown). The arc detector circuit 32 further includes a light sense input configured to receive a light sensor signal from a light sensor 50. Responsive to these inputs, the arc detector circuit 32 provides optical signals to a detector signal input of the arc quenching device driver circuit 34. Responsive to assertion of a signal on this fiber optic link, the arc quenching device driver circuit 34 drives an arc quenching device 20. For example, the arc quenching device driver circuit 34 may provide a current sufficient to actuate a consumable ribbon-type arc generator, such as the one in the arc mitigation device described in the aforementioned U.S. Patent Application Publication No. 2016/0285259 to Shea et al.

A test console 410 may include a test control circuit 412 configured to be coupled to the current sense input of the arc detector circuit 32 and to provide a current that simulates behavior of the CT coupled to the current sense input. The test control circuit 412 is also coupled to a light source 420 that is configured to provide light to the light sensor 50. The test control circuit 412 may also be coupled to an enable signal input of the arc quenching device driver circuit 34 and may provide a signal (e.g., by using a jumper) that disables firing of the arc quenching device 20 by the arc quenching device driver circuit 34 during a test operation. As further shown, the arc quenching device driver circuit 34 may provide a status output indicative of a firing state of the device (e.g., fired or inactive). Such a signal may be used, for example, to provide an indication at a user interface of a switchgear or other unit in which the arc quenching system is included, or may be provided to the test control circuit 412, which may provide an indication of test status to an operator via a user interface (e.g., an indicator light or display).

Figure 8:
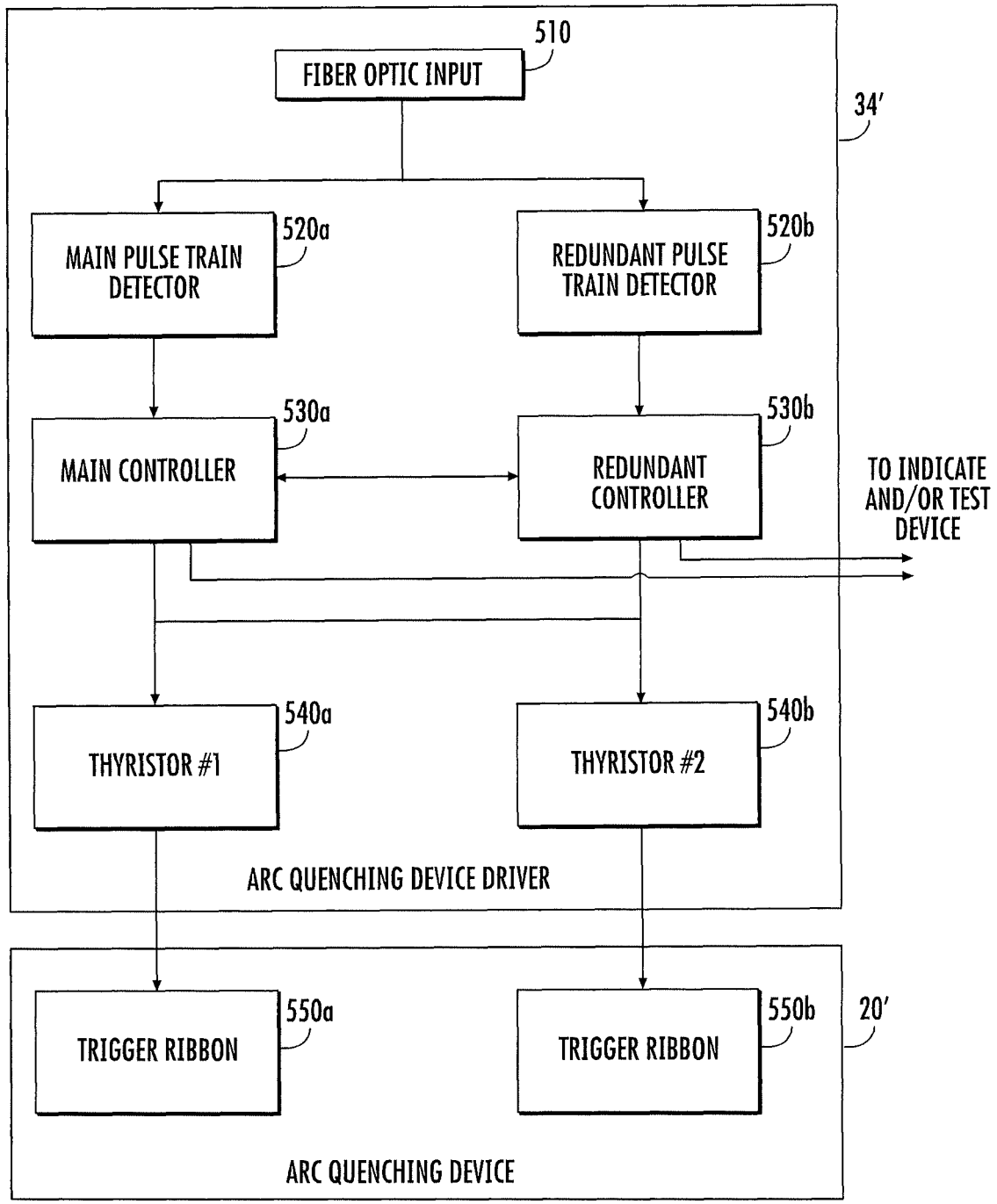
FIG. 8 is a schematic diagram illustrating an arc quenching device controller according to further embodiments.

FIG. 8 illustrates an example of an arc quenching device driver 34' and an arc quenching device 20' according to some embodiments. The arc quenching device 20' may include first and second trigger ribbons 550a, 550b, which are used to initiate a controlled arc by shorting electrodes to create an arc-sustaining plasma between the electrodes. The trigger ribbons 550a, 550b receive current from first and second thyristors 540a, 540b, which are controlled by main and redundant controllers 530a, 530b. The main and redundant controllers 530a, 530 activate the thyristors 540a, 540b to provide current to the trigger ribbons 550a, 550b responsive to an optical pulse train signal applied to a fiber optic input 510 and detected by main and redundant pulse train detectors 520a, 520b. The main and redundant controllers 530a, 530b may also provide status signals that can be used to generate a status indication (e.g., "standby" or "fired") at a user interface for the arc quenching system and/or to a test apparatus for testing such a system, as described above.

The arc quenching device controller 34' and arc quenching device 20' illustrated in FIG. 8 are examples of arc quenching system components with which test apparatus and methods according to some embodiments of the inventive subject matter may be used. However, it will be appreciated that test apparatus and methods according to further embodiments of the inventive subject matter may be used with other types of arc quenching systems, such as arc quenching systems that use shorting bars or other mechanisms to extinguish unwanted arcs.

In the drawings and specification, there have been disclosed exemplary embodiments of the inventive subject matter. Although specific terms are employed, they are used in a generic and descriptive sense only and not for purposes of limitation, the scope of the inventive subject matter being defined by the following claims.

The invention claimed is:

1. A test apparatus comprising:
   an output configured to be coupled to a sense input of an arc quenching device control circuit of an arc quenching system that has a normal mode in which a consumable arc generating component is consumed in an arc quenching operation and test mode in which the arc quenching device control circuit generates a status signal indicative of a triggering of the arc quenching device while preventing consumption of the consumable arc generating component;
   a user interface; and
   a control circuit configured to generate a control signal to place the arc quenching device in the test mode and to generate a simulated sense signal at the sense input of the arc quenching device control circuit in response to an input at the user interface, the simulated sense signal representing a physical state associated with a fault condition of a bus coupled to the arc quenching system.

2. The test apparatus of claim 1, wherein the physical state comprises a voltage condition, a current condition, a temperature, a pressure or a light intensity.

3. The test apparatus of claim 1, wherein the simulated sense signal comprises a current indicative of a current passing through a bus to which the arc quenching system is connected.

4. The test apparatus of claim 3, wherein the simulated sense signal comprises an AC current.

5. The test apparatus of claim 4, wherein the current is adjustable responsive to the user interface.

6. The test apparatus of claim 3, wherein the control circuit is configured to cause a light source to emit light concurrent with assertion of the simulated sense signal.

7. The test apparatus of claim 6, wherein the control circuit further comprises a light source control output configured to be coupled to the light source and wherein the control circuit is configured to assert a light source control signal at the light source control output to cause the light source to emit light concurrent with assertion of the current sense signal.

8. The test apparatus of claim 1, further comprising a housing that houses the control circuit and provides external access to the signal output.

9. The test apparatus of claim 8, wherein the housing is portable.

10. A test apparatus comprising:
    an output configured to be coupled to a current transformer input of arc quenching device control circuit of an arc quenching system that has a normal mode in which a consumable arc generating component is consumed in an arc quenching operation and test mode in which the arc quenching device control circuit generates a status signal indicative of a triggering of the arc quenching device while preventing consumption of the consumable arc generating component;
    a user interface; and
    a control circuit configured to generate a control signal to place the arc quenching device in the test mode and to generate a current at the output concurrent with emission from a light source responsive to the user interface.

11. The test apparatus of claim 10, wherein the current is sufficient to cause the arc quenching device control circuit to trigger an arc quenching device.

12. The test apparatus of claim 10, wherein the current is an AC current.

13. The test apparatus of claim 10, wherein current is adjustable responsive to the user interface.

14. The test apparatus of claim 10, further comprising a housing that houses the control circuit and provides external access to the output.

15. The test apparatus of claim 10, wherein the control circuit is configured to control emission of light by the light source.

16. The test apparatus of claim 15, wherein the control circuit further comprises a light source control signal output configured to be coupled to the light source and wherein the control circuit is configured to assert a light source control signal at the light source control signal output to cause the light source to emit light concurrent with assertion of the current.

17. A method of testing an arc quenching device control circuit of an arc quenching system that has a normal mode in which a consumable arc generating component is consumed in an arc quenching operation and test mode in which the arc quenching device control circuit generates a status signal indicative of a triggering of the arc quenching device while preventing consumption of the consumable arc generating component, the method comprising:
    applying a control signal to the arc quenching device control circuit to place the arc quenching system in the test mode:
    applying a simulated sense signal from a test apparatus to a sense input of the arc quenching device control circuit, the simulated sense signal representing a physical state associated with a fault condition of a bus coupled to the arc quenching device; and
    detecting operation of the arc quenching device control circuit responsive to the simulated sense signal.

* * * * *